(12) United States Patent
Vashchenko

(10) Patent No.: US 8,237,177 B2
(45) Date of Patent: Aug. 7, 2012

(54) FULLY SILICON ALED-PHOTODIODE OPTICAL DATA LINK MODULE

(75) Inventor: Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 150 days.

(21) Appl. No.: 12/804,069

(22) Filed: Jul. 12, 2010

(65) Prior Publication Data

US 2012/0007105 A1 Jan. 12, 2012

(51) Int. Cl.
*H01L 33/00* (2010.01)
(52) U.S. Cl. ............ 257/84; 257/E33.077; 438/24
(58) Field of Classification Search ............ 257/84, 257/85, E33.077; 438/24, 25
See application file for complete search history.

(56) References Cited

U.S. PATENT DOCUMENTS

2008/0001139 A1* 1/2008 Augusto ............ 257/13
* cited by examiner

*Primary Examiner* — Julio J Maldonado
*Assistant Examiner* — Daniel Shook
(74) *Attorney, Agent, or Firm* — Eugene C. Conser; Wade J. Brady, III; Frederick J. Telecky, Jr.

(57) ABSTRACT

In a silicon-based light emitting diode-photodiode (LED-PD) arrangement, the LED is implemented as an avalanche LED (ALED) and the ALED and PD are integrated into a common integrated circuit. The ALED is formed around a cross-shaped PD and is separated from the PD by a deep trench region. In order to create current crowding close to the deep trench the ALED includes an NBL or PBL having a narrowing at its end.

9 Claims, 4 Drawing Sheets

FULLY SILICON ALED-PHOTODIODE OPTICAL DATA LINK MODULE

FIELD OF THE INVENTION

The invention relates to optical galvanic isolation (OGI).

BACKGROUND OF THE INVENTION

OGI is usually realized using a light emitter and a receiver. The light emitter commonly takes the form of a light emitting diode (LED), and the receiver takes the form of a photo diode (PD), to define a LED-PD combination.

In order to emit the requisite amount of light for detection by the PD, the LED is commonly made of material such as Ge, GaAs, InAs. In the most common form of light generation, photons are emitted by the recombination of electron-hole pairs. The amount of energy required to excite the electron and the amount of energy emitted in the form of light depends on the band gap of the material, which is related to the atomic structure of the material.

Atoms comprise a nucleus of protons and usually neutrons, with electrons occupying discrete energy levels or shells around the nucleus. When multiple atoms or molecules combine into a solid the resultant structure defines substantially continuous energy bands. These energy bands are however continuously varying due to varying energy distributions of electrons in the bands. Between the energy bands are regions where no electrons vibrate. Thus, in order for an electron to be excited to the next level, energy, e.g., heat has to be imparted on the electron to create an electron-hole pair in which the electron moves to a higher energy level. When an electron drops back to a lower energy level to recombine with a hole, the energy is emitted as light or sound. The minimal-energy state in the conduction band, and the maximal-energy state in the valence band, are each characterized by a certain k-vector in the Brillouin zone. If the k-vectors are the same, it is called a "direct gap". If they are different, it is called an "indirect gap".

FIG. 1 shows an energy diagram depicting energy vs. K norm curves for various materials. The low energy (non conductive) band, known as the valence band, is indicated by curve 100, which depicts the maximal energy state in the valence band. In order for an electron to be excited into the conduction band (band 102 for InAs; band 104 for GaAs; band 106 for Ge; band 108 for Si), which depict the minimal energy state in the conduction band of each of these materials, energy has to be imparted on the electron. Since the electrons can be excited to higher levels than the lowest energy level in the conduction band, excitation energies and subsequent recombination energies may be several times the band gap energy.

As is depicted in FIG. 1, the bands of the various materials have different widths. Also, in FIG. 1 all of the materials are semiconductor materials and the valence band is shown to be separated from each conduction band by a band gap, which can be thought of as continuously varying in width and position. (In the case of metals the valence band would overlap the conduction band, providing for free electron movement, however in the case of a semiconductor material, as shown in FIG. 1, a band gap exists between the valence band and the conduction band).

In practice, in a lattice structure of atoms or molecules, electrons move not only in two dimensions as shown in FIG. 1. Instead, electron movement is in three dimensions and may be depicted by a wave vector (k) that has both magnitude and direction. This impacts the ability of electrons of a particular material to be excited to the conduction band. For example, in the case of GaAs (direct band gap material) the valence band is depicted as being directly below the bottom of the conduction band (i.e. the direction of the wave vector is in the same direction in the valence band to that in the conduction band) therefore but no change in momentum is required to excite and electron to the conduction band. Thus GaAs is called a direct band gap material. This is depicted in FIG. 2, which shows Energy vs. crystal momentum for a semiconductor with a direct band gap. In such a material an electron can shift from the lowest-energy state in the conduction band to the highest-energy state in the valence band without a change in crystal momentum. Depicted is a transition in which a photon excites an electron from the valence band to the conduction band.

In contrast, in some other solids, such a Si the top of the valence band is not directly below the bottom of the conduction band (i.e. the direction of the wave vector is different in the valence band to that in the conduction band). Thus, not only is an addition of energy required but also a change in momentum in exciting an electron from the valence band to the conduction band in silicon. This is depicted in FIG. 3, which shows Energy vs. crystal momentum for a semiconductor with an indirect band gap, showing that an electron cannot shift between the lowest-energy state in the conduction band to the highest-energy state in the valence band without a change in momentum. Here, almost all of the energy comes from a photon (vertical arrow 300), while almost all of the momentum comes from a phonon (horizontal arrow 302).

Silicon is an example of an indirect band gap material and thus requires a momentum change for exciting an electron to the conduction band.

Interactions among electrons, holes, phonons, photons, and other particles are required to satisfy conservation of energy and crystal momentum (i.e., conservation of total k-vector). A photon with an energy near a semiconductor band gap has almost zero momentum. An important process is called radiative recombination, where an electron in the conduction band recombines with a hole in the valence band, releasing the full excess energy as a photon. This process is possible in a direct band gap semiconductor if the electron is near the bottom of the conduction band and the hole is near the top of the valence band (as is usually the case). However this process is not possible in an indirect band gap material, because conservation of crystal momentum would be violated. For radiative recombination to occur in an indirect band gap material, the process must also involve the absorption or emission of a phonon, where the phonon momentum equals the difference between the electron and hole momentum, or the energy difference can be achieved by a crystallographic defect, which performs essentially the same role. The involvement of the phonon makes this process much less likely to occur in a given span of time, which is why radiative recombination is far slower in indirect band gap materials than direct band gap ones. This is also why light-emitting and laser diodes are almost always made of direct band gap materials, and not indirect band gap material like silicon.

The fact that radiative recombination is slow in indirect band gap materials also means that, under most circumstances, radiative recombinations will be a small proportion of total recombinations, with most recombinations being non-radiative, taking place at point defects or at grain boundaries. However, if the excited electrons are prevented from reaching these recombination places where they can combine in a non-radiative recombination, they have no choice but to eventually fall back into the valence band by radiative recombination, which can be enhanced by creating a dislocation loop in the material.

Thus, while indirect band gap materials like Si can theoretically be excited to create electron-hole pairs, and the electrons can theoretically recombine in electron-hole pairs, emitting the energy as light, no practical Si LED has been developed because of the indirect band gap nature of silicon discussed above.

The present invention proposes a practical avalanche LED (ALED) and photo diode (PD) pair made of silicon in which the ALED/PD combination is configured to arrange avalanche breakdown junctions of the ALED and PD in close proximity to each other and with different spacings to accommodate different wavelength energies.

SUMMARY OF THE INVENTION

According to the invention, there is provided an ALED-PD structure, comprising an avalanche light emitting diode (ALED) and a photodiode (PD) integrated as a single integrated circuit (IC). The ALED typically includes an anode and a cathode defining an avalanche breakdown junction between buried layers of the anode and cathode or between a buried layer and a sinker of the anode and cathode. The photo diode (PD) may include an anode and a cathode in which the anode of the PD comprises a central anode defined by a p+ region formed in an n-epitaxial region. The cathode of the PD may comprise multiple n+ regions formed around the anode of the PD. The anode and cathode of the PD may be laid out to define a cross, with a cross-shaped isolation region e.g., a deep trench isolation (DTI) region formed around the PD, the cross defining internal corners. The cathode of the PD may include the n-epitaxial region and one or more n+ regions formed in the n-epitaxial region. The anode of the PD may include a p-sinker (PS) exending below the p+ region of the PD. The ALED-PD structure may be formed as part of a CMOS or BiCMOS SOI process. Any buried layers formed in the PD as part of the CMOS or BiCMOS SOI process are preferably removed to leave the PD without any buried layer. The ALED may include two anodes and two cathodes, each anode or cathode extending into an internal corner of the cross defined by the DTI.

The buried layer of at least one of the anode and cathode of the ALED may be configured to be narrowed toward its end defining the avalanche junction. The narrowing of the buried layer preferably is such as to enhance current crowding to promote local avalanche breakdown.

Further, according to the invention, there is provided a method of forming a silicon ALED-PD structure, comprising forming the ALED and the PD as part of the same process in an integrated circuit. The ALED and PD may be formed in a CMOS or BiCMOS SOI process. The ALED-PD may include an ALED surrounding a PD. The method may comprise forming at least one ALED anode of a first doping type and at least one ALED cathode of a second doping type, each ALED anode and ALED cathode including a sinker of their doping type, and at least one of the ALED anode and ALED cathode including a buried layer of their doping type to define an avalanche breakdown region in the ALED between one of the buried layers of one doping type and a sinker or buried layer of opposite doping type.

The method may include narrowing the ends of at least some of the buried layers to where, under normal operation, local avalanche breakdown takes place due to current crowding at the junction between the buried layer and the buried layer or sinker of opposite doping type. The method may include separating the ALED from the PD by a cross-shaped deep trench isolation region defining four internal angles, and forming the ALED anodes and ALED cathodes in the internal angles.

A method of forming a high pulse frequency LED-PD structure, comprising forming an LED around a PD as part of a common IC process. The LED may include an avalanche junction to define an ALED, and the PD may include a detector junction. The method may comprise implementing the ALED and PD in silicon and preferably includes configuring the PD detector junction to extend below the level of the ALED junction. A deep trench isolation (DTI) may be formed between the ALED and the PD, the PD extending below the level of the DTI. The method may include increasing the frequency of the light pulse by configuring the ALED junction to enhance current crowding to promote local avalanche breakdown.

DETAILED DESCRIPTION OF THE INVENTION

Figure 1:
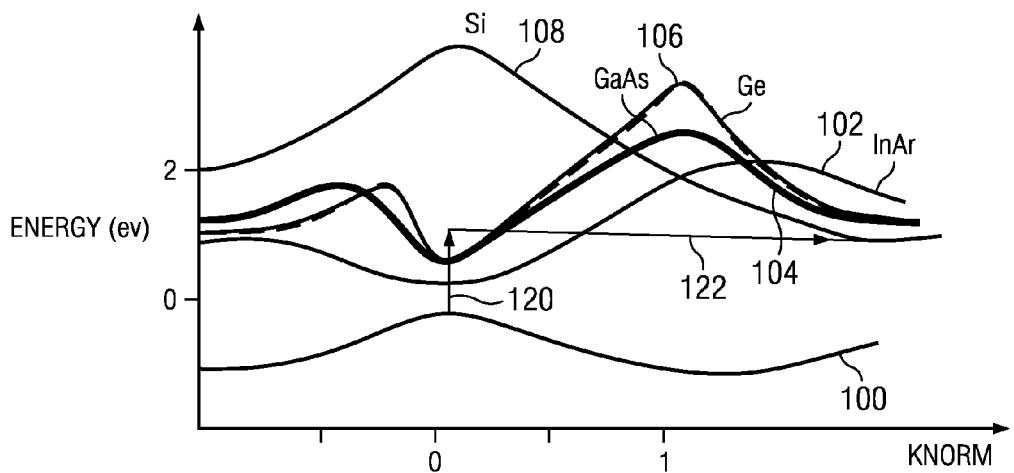
FIG. 1 shows band-gap energies for different materials.
Figure 2:
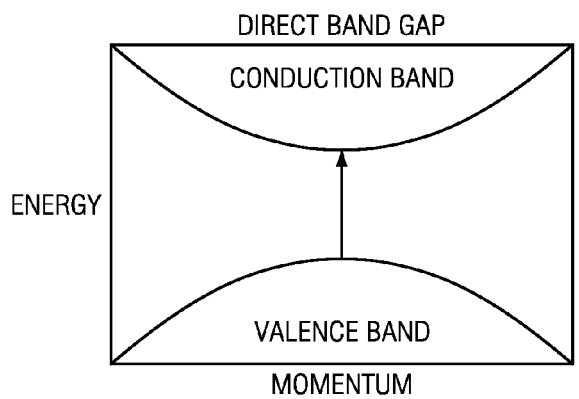
FIG. 2 shows a energy vs. momentum curve for a direct band gap material.
Figure 3:
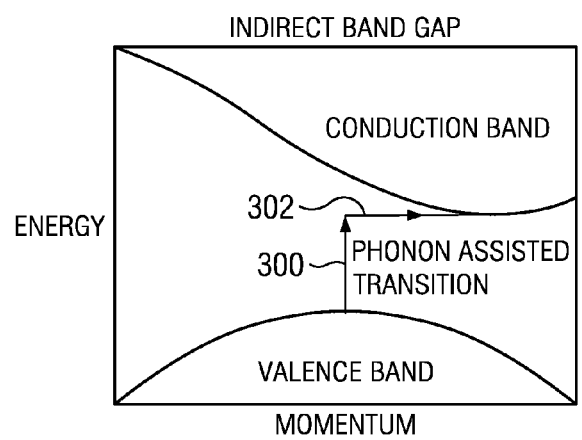
FIG. 3 shows a energy vs. momentum curve for an indirect band gap material.
Figure 4:
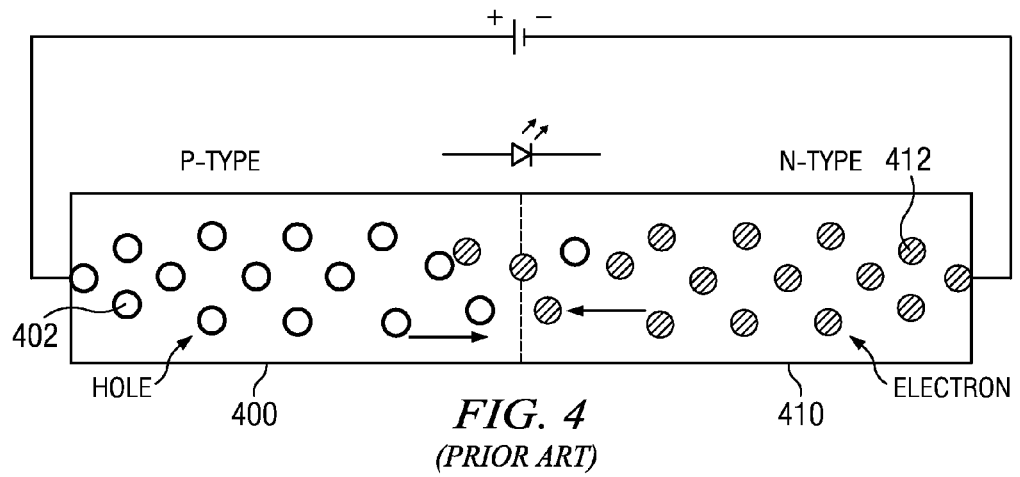
FIG. 4 shows a simple LED structure with corresponding band-gap diagram.
Figure 5:
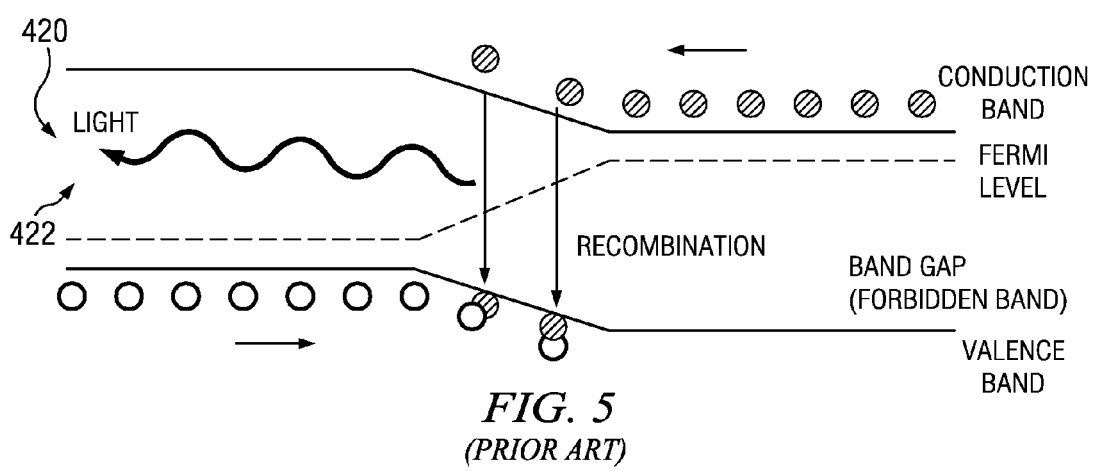
FIG. 5 shows a top view of a prior art LED-PD structure.

The functioning of a typical LED is shown in FIG. 4. The LED comprises a p-type material 400 defining holes 402, and an n-type material 410 with electrons 412. When the junction across the p-type and n-type material is forward biased, electrons pass across the junction and recombine with holes, thereby dropping from the conduction band to the valence band as depicted by the band gap diagram of FIG. 5 below the LED structure. The result of the electron-hole recombination is the emission of light 522.

As discussed above, the indirect band-gap nature of silicon has had the effect that there are no practical Si based LEDs. The present invention proposes an avalanche LED and photo diode structure that makes it possible to provide a practical optical galvanic isolation (OGI) structure using a fully silicon-based process. By implementing the OGI structure (also referred to as an OGI module or LED-PD structure) in silicon it allows the module to be integrated into a CMOS or BiCMOS process.

In silicon the longitudinal relaxation time is of the order of $10^{-12}$s compared to a typical electron-hole recombination time in prior art OGI's of the order of $10^{-9}$s. By implementing a workable silicon OGI module based on avalanche breakdown in the LED, a ALED-PD combination can be provided that generates light pulses in the 1-25 GHz range.

In order to appreciate the structural differences between a silicon based optical galvanic isolator (OGI) using an avalanche LED (ALED)—photodiode (PD) implemented in a CMOS or BiCMOS SOI (silicon on insulator) process as proposed by the present invention, compared to a prior art compound semiconductor OGI implemented in a direct bandgap material, it should be noted that in the prior art device the likelihood of electron-hole formation and recombination depends on the nature of the direct bandgap material, which requires no additional phonons. In contrast, the present invention overcomes the drawback presented by the indirect bandgap nature of silicon by providing an avalanche breakdown region that increases the number of carriers to such a great extent that electron-hole creation and recombination becomes viable in silicon. In addition, by integrating the avalanche LED and PD in one device rather than having stand-alone LED and PD devices or co-packaged devices, as in the prior art, the present invention permits the ALED and PD to be configured in close proximity to each other with their avalanche junctions arranged close together.

Figure 6:
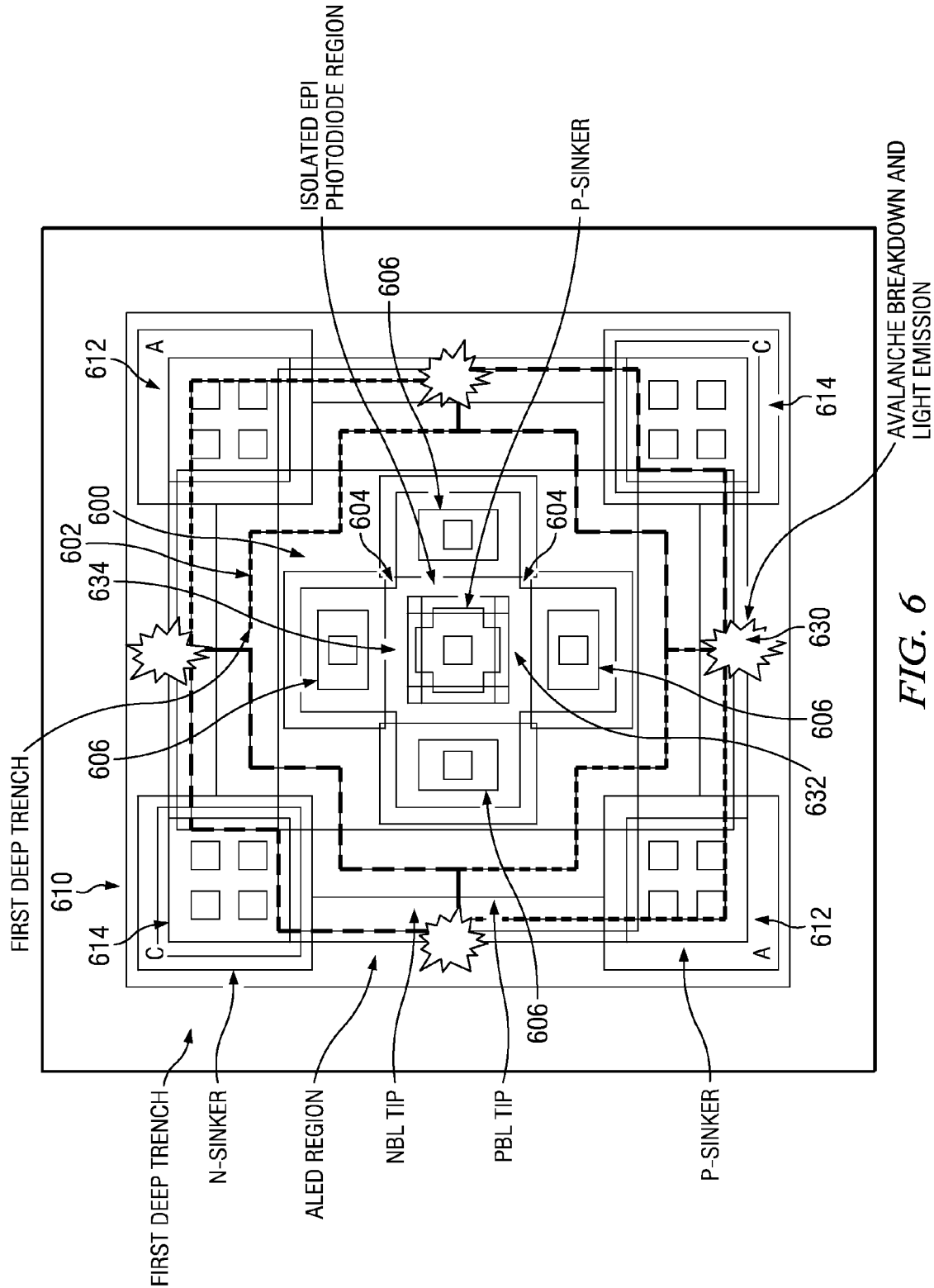
FIG. 6 shows a top view of one embodiment of a silicon ALED-PD of the invention.

In one embodiment, the present invention makes use of a silicon OGI that provides an integrated layout of the anode and cathode of the avalanche LED (ALED) to bring the light generating region closer to the DTI that separates the ALED from the PD. It also makes use of a standard CMOS or BiCMOS SOI process to implement the OGI and provides for light generation by avalanche breakdown between an n-buried layer (NBL) and a p-buried layer (PBL) or between an n-type sinker (NS) and a PBL or between a p-type sinker (PS) and an NBL, of the anode and cathode regions of the ALED. One embodiment of an OGI of the invention is shown in FIG. 6, which shows a PD 600 in the form of a cross with a Deep Trench Isolation (DTI) 602 separating the PD 600 from an ALED 610 with its anode regions 612 and cathode regions 614. The DTI 602 thus forms internal corners 604, which allow the anode regions 612 and cathode regions 614 of the ALED to be positioned closer to the anode-cathode junctions of the PD 600.

Figure 7:
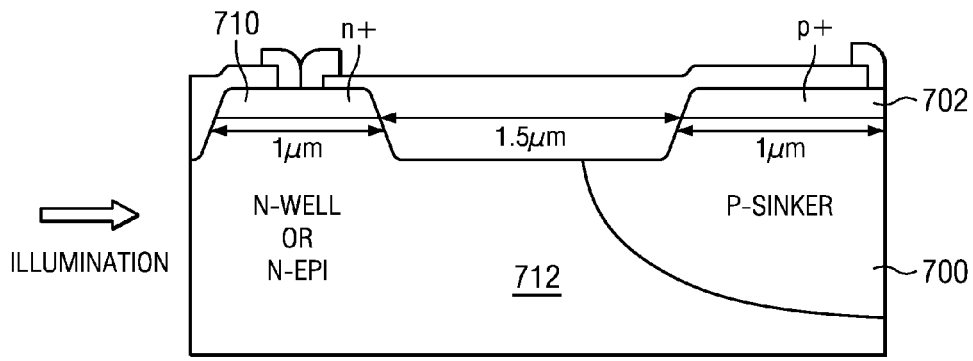
FIG. 7 shows a cross section through one embodiment of a silicon based PD of the invention.

The PD 600 includes a central anode 604 with four cathodes 606 formed around the anode 604, defining the arms of a cross. As shown in FIG. 7, one embodiment of a PD of the invention comprises a p-sinker 700 extending downward from a p+ region 702 defining an anode such as the anode 604. The cathode is defined by an n+ region 710 formed in a lightly doped n-type region in the form of an n-epitaxial region or n-well 712. In practice, using a silicon-on-insulator (SOI) process, the lower epitaxial region of the SOI structure is preferably retained to define the epi region 712. An n-well may optionally be formed in the epi region. However, both the n-buried layer (NBL) and p-buried layer (PBL) of the SOI structure are removed leaving only the relatively low doped n-epi region (and optionally an n-well formed in the epi). This low doped region is suitable for light detection in accordance with the present invention.

Figure 8:
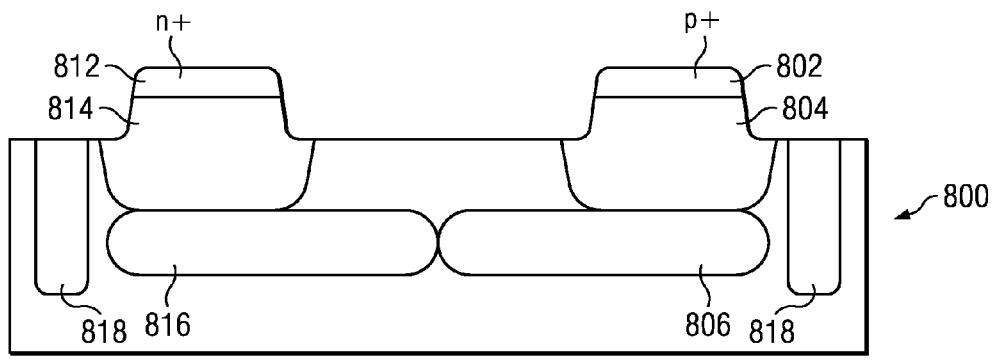
FIG. 8 shows one embodiment of a silicon-based ALED of the invention.

One embodiment of an ALED, showing only one anode and one cathode, is shown in cross-section in FIG. 8. The ALED 800 includes a p+ region 802 with a p-sinker (PS) 804 and an in-depth p-buried layer (PBL) 806, defining the anode of the ALED. The cathode is defined by an n+ region 812 connected to an n-sinker (NS) 814 and an in-depth n-buried layer (NBL) 816. The PBL 814 and NBL 816 may lie at a depth of about 1 µm. Thus the light is generated at depth in the silicon structure of the ALED. A DTI 818 is formed around the ALED to separate it from the photo diode (PD) (not shown in FIG. 8). The PD discussed above, may extend to a depth of about 2 µm for detecting light emitted from the junction of the PBL 814 and NBL 816. The depth of the PD also provides an uninterrupted photon path for light emitted from the ALED junction (it being appreciated that the embodiment shown in FIG. 6 with its two anodes and two anodes, defines four anode-cathode avalanche junctions). Due to the cross-shaped configuration of the PD, the distance between the light emitting (avalanche) junction of the ALED and the detector junction of the PD can also be minimized since the anodes and cathodes of the ALED, in effect occupy the internal corners of the cross-shaped DTI that surrounds the PD, bringing the avalanche junction closer toward the opposing anode-cathode detector junction of the PD. This provides for more efficient capture of the lateral emission from the ALED avalanche junction.

In the configuration shown in FIG. 6, the spacing between the ALED junctions and the PD junctions across the DTI 602 is such that blue light is captured at the closes anode-cathode junction (in the vicinity of the DTI 602), while longer wavelength red light and infra red is captured at the opposite anode-cathode junction. For example for the junction 630 of the ALED, blue light is captured by the anode-cathode avalanche breakdown junction 632, while longer wavelengths are captured at the opposite anode-cathode avalanche breakdown junction 634. One aspect of the present invention that allows the low energy emissions of the indirect band-gap Si material to be used in an OGI, is the creation of a local breakdown region in the ALED. This is achieved by forming a buried layer width that narrows toward the tip of the PBL or NBL or both PBL and NBL to create current crowding and take advantage of current pinching and filamentation to achieve local avalanche breakdown.

Figure 9:
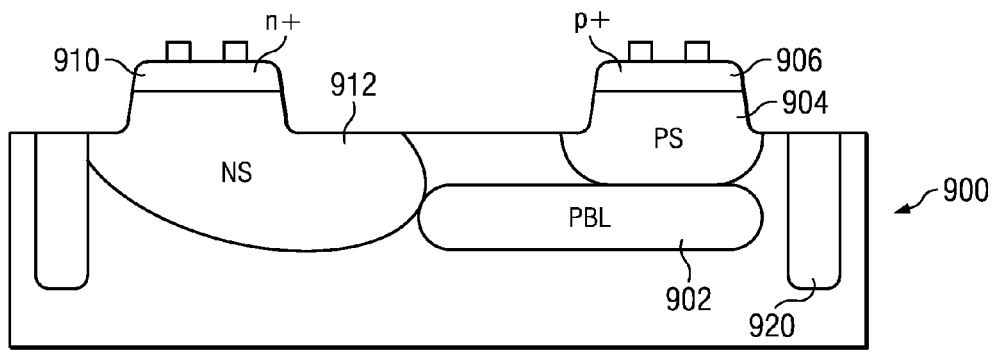
FIG. 9 shows another embodiment of a silicon-based ALED of the invention.
Figure 10:
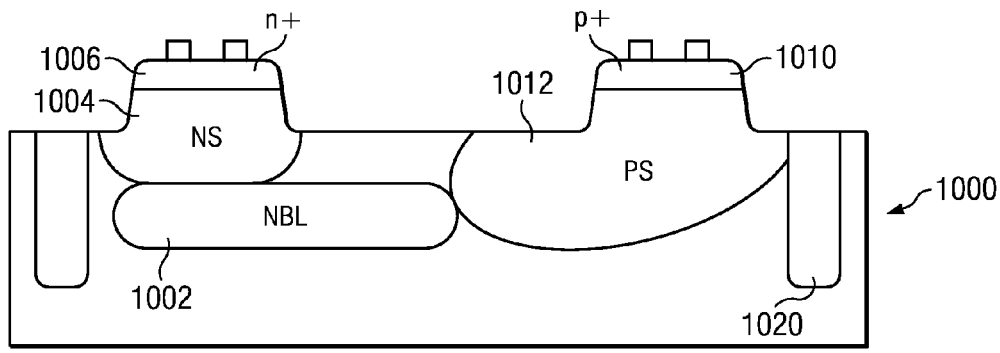
FIG. 10 shows yet another embodiment of a silicon-based ALED of the invention.

In the embodiment of FIG. 8, the breakdown junction for the ALED was defined by an NBL-PBL junction. Two other embodiments of the invention are shown in FIGS. 9 and 10. In FIG. 9 the ALED 900 includes a PBL 902 connected to a PS 904 and a p+ region 906 to define the anode. The cathode comprises an n+ region 910 connected to an NS 912. The breakdown junction in this embodiment is thus formed between the PBL 902 and the NS 912. Again, in order to achieve local avalanche breakdown the PBL 902 is narrowed toward its end where it forms the junction with the NS 912, to achieve current crowding. A DTI 920 is formed around the ALED.

In the embodiment of FIG. 10 the ALED 1000 includes an NBL 1002 connected to an NS 1004 and an n+ region 1006 to define the cathode. The anode comprises a p+ region 1010 connected to a PS 1012. The breakdown junction in this embodiment is thus formed between the NBL 1002 and the PS 1012. Again, in order to achieve local avalanche breakdown the NBL 1002 is narrowed toward its end where it forms the junction with the PS 1012, to achieve current crowding. The compact structure of the ALED-PD structure of the invention provides the additional benefits of a small footprint making it more cost effective than prior art OGI units, and providing correspondingly lower losses and greater efficiency and resulting in lower parasitic capacitance.

While the present invention was described with respect to specific embodiments, it will be appreciated that the invention is not so limited but could be implemented in different ways without departing from the scope of the invention as defined by the claims.

What is claimed is:
1. An ALED-PD structure, comprising
an avalanche light emitting diode (ALED),
a photo diode (PD) integrated as a single integrated circuit (IC),
wherein said ALED and PD are implemented in silicon,
also wherein said ALED also includes an anode and a cathode defining an avalanche breakdown junction between buried layers of the anode and cathode or between a buried layer and a sinker of the anode and cathode, also wherein said photo diode (PD) includes an anode and a cathode in which the anode of the PD comprises a central anode defined by a p+ region formed in an n-epitaxial region, and also wherein the cathode of the PD comprises multiple n+ regions formed around the anode of the PD.

2. An ALED-PD structure of claim 1, wherein the anode and cathode of the PD are laid out to define a cross, with a cross-shaped isolation region formed around the PD, the cross defining internal corners.

3. An ALED-PD structure of claim 2, wherein the cathode of the PD includes the n-epitaxial region and one or more n+ regions formed in the n-epitaxial region.

4. An ALED-PD structure of claim 3, wherein the anode of the PD includes a p-sinker (PS) extending below the p+ region of the PD.

5. An ALED-PD structure of claim 1, wherein the ALED-PD structure is formed as part of a CMOS or BiCMOS SOI process, also wherein any P or N type buried layers formed in the PD as part of the CMOS or BiCMOS SOI process are removed to leave the PD without any P or N Type buried layers, and also wherein the ALED includes two anodes and two cathodes, each anode or cathode extending into an internal corner of the cross defined by the deep trench isolation (DTI).

6. An ALED-PD structure of claim 1 wherein the buried layer of at least one of the anode and cathode of the ALED is configured to be narrowed toward its end defining the avalanche junction.

7. A method of forming a silicon ALED-PD structure, comprising forming the ALED and the PD as part of the same process in an integrated circuit, wherein the ALED and PD are formed in a CMOS or BiCMOS SOI process, also wherein the ALED is formed to extend around the PD, and also wherein at least one ALED anode is formed of a first doping type and at least one ALED cathode is formed of a second doping type, each ALED anode and ALED cathode including a sinker of their doping type, and at least one of the ALED anode and ALED cathode including a buried layer of their doping type to define an avalanche breakdown region in the ALED between one of the buried layers of one doping type and a sinker or buried layer of the opposite doping type.

8. A method of claim 7, further comprising narrowing the ends of at least some of the buried layers to where, under normal operation, local avalanche breakdown takes place due to current crowding at the junction between one of the buried layers and a buried layer or sinker of opposite doping type.

9. A method of claim 7, further comprising separating the ALED from the PD by a cross-shaped deep trench isolation region defining four internal angles, and forming the ALED anodes and ALED cathodes in the internal angles.

* * * * *